(12) United States Patent
Lee et al.

(10) Patent No.: US 10,797,135 B2
(45) Date of Patent: Oct. 6, 2020

(54) ASYMMETRIC SOURCE/DRAIN REGIONS OF TRANSISTORS

(71) Applicant: Micron Technology, Inc., Boise, ID (US)

(72) Inventors: Si-Woo Lee, Boise, ID (US); Yunfei Gao, Boise, ID (US); Srinivas Pulugurtha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/209,495

(22) Filed: Dec. 4, 2018

(65) Prior Publication Data
US 2020/0176564 A1 Jun. 4, 2020

(51) Int. Cl.
*H01L 29/788* (2006.01)
*H01L 29/08* (2006.01)
*H01L 27/108* (2006.01)
*H01L 21/8234* (2006.01)
*H01L 27/088* (2006.01)

(52) U.S. Cl.
CPC .. *H01L 29/0847* (2013.01); *H01L 21/823418* (2013.01); *H01L 21/823468* (2013.01); *H01L 27/088* (2013.01); *H01L 27/10805* (2013.01); *H01L 27/10847* (2013.01)

(58) Field of Classification Search
CPC ................... H01L 27/11521; H01L 29/7885
USPC ........................................................ 257/315
See application file for complete search history.

(56) References Cited

U.S. PATENT DOCUMENTS

| | | | |
|---|---|---|---|
| 5,811,338 A | 9/1998 | Kao et al. | |
| 6,008,080 A * | 12/1999 | Chuang | H01L 27/0266 257/E21.661 |
| 6,121,093 A | 9/2000 | Cheng et al. | |
| 6,482,724 B1 | 11/2002 | Chatterjee | |
| 7,208,397 B2 | 4/2007 | Feudel et al. | |
| 7,855,118 B2 | 12/2010 | Hoentschel et al. | |
| 8,138,797 B1 | 3/2012 | Liu et al. | |
| 8,426,279 B2 | 4/2013 | Chen | |
| 9,324,850 B2 * | 4/2016 | Kang | H01L 29/775 |

* cited by examiner

*Primary Examiner* — Tan N Tran
(74) *Attorney, Agent, or Firm* — Brooks, Cameron & Huebsch, PLLC

(57) ABSTRACT

An example apparatus includes a first transistor and a second transistor, each having asymmetric source/drain regions. A source/drain region of the first transistor is directly coupled to a source/drain region of the second transistor at a junction. A depth of the junction is greater than a depth of another source/drain region of the first transistor and a depth of another source/drain region of the second transistor.

14 Claims, 8 Drawing Sheets

ASYMMETRIC SOURCE/DRAIN REGIONS OF TRANSISTORS

TECHNICAL FIELD

The present disclosure relates generally to semiconductor devices and methods, and more particularly to asymmetric source/drain regions of transistors.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
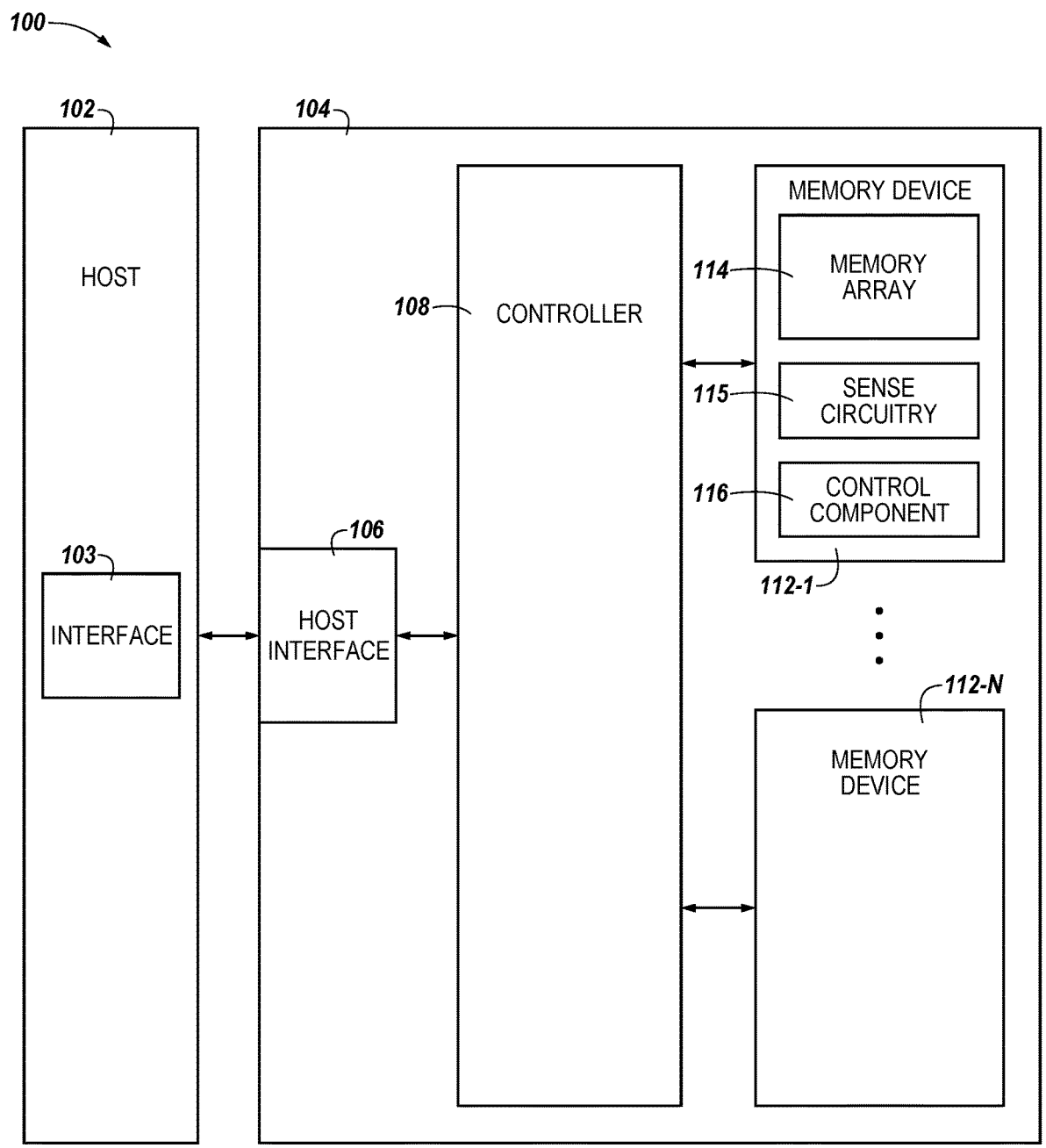
FIG. 1 is a functional block diagram of a computing system including at least one memory system in accordance with one or more embodiments of the present disclosure.

The physical size of memory devices is getting smaller. Memory devices can include memory cells including a transistor and a storage element (e.g., a 1T1C (one transistor one capacitor) memory cell. The memory cells can be on pitch with other components of a memory devices such as sensing circuitry (e.g., sense amplifiers) and sub wordline drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). The halo margin may be worsened and there may be a threshold voltage (Vt) mismatch between adjacent transistors. The increasing the space between adjacent transistors may reduce the probability of SCE but it may also limit the minimum pitch of other components of the memory device. In some previous approaches, a trench (e.g., a recessed channel) may be formed between adjacent transistors to overcome the SCE. However, decreasing the pitch between transistors may also increases the probability of capacitive coupling (disturbs) of adjacent transistors. A trench may not impede, and may even increase, the capacitive coupling of adjacent transistors.

The depth of a junction of source/drain regions of adjacent transistors can impact properties of the adjacent transistors. For example, some previous approaches include shallow source/drain regions of transistors such that the junction of source/drain regions of adjacent transistors is shallow. A shallow junction may decrease the probability of SCE, reduce gate-induced drain leakage (GIDL), and reduce drain-induced barrier lowering (DIBL). However, the probability of capacitive coupling of the adjacent transistors is increased. In some other previous approaches, the source/drain regions of transistors may be deep such that the junction of source/drain regions of adjacent transistors is deep. A deep junction may decrease the probability of capacitive coupling of adjacent transistors, but the probability of SCE is increased and GIDL is increased.

The present disclosure includes apparatuses and methods related to asymmetric source/drain regions of transistors. In contrast to some previous approaches, the depth of a first source/drain region of a transistor is different than a second source/drain region of the transistor such that the source/drain regions of the transistor are asymmetric. An example of an apparatus described herein includes, in a number of embodiments, a first transistor and a second transistor, each having asymmetric source/drain regions. A source/drain region of the first transistor is directly coupled to a source/drain region of the second transistor at a junction. A depth of the junction is greater than a depth of another source/drain region of the first transistor and a depth of another source/drain region of the second transistor.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of memory devices can refer to one or more memory devices and a number of iterations of particular elements recited in a claim can refer to performing the particular elements in one or more cycles.

The figures herein follow a numbering convention in which the first digit or digits correspond to the figure number of the drawing and the remaining digits identify an element or component in the drawing. Similar elements or components between different figures may be identified by the use of similar digits. For example, 226 may reference element "26" in FIG. 2, and a similar element may be referenced as 326 in FIG. 3. In some instances, a plurality of similar, but functionally and/or structurally distinguishable, elements or components in the same figure and/or in different figures may be referenced sequentially with the same element number (e.g., 112-1 and 112-N in FIG. 1).

FIG. 1 is a functional block diagram of a computing system 100 including at least one memory system 104 in accordance with one or more embodiments of the present disclosure. The memory system 104 can be, for example, a semiconductor device and/or a solid-state drive (SSD).

In the embodiment illustrated in FIG. 1, the memory system 104 includes a host interface 106, a number of memory devices 112-1, ..., 112-N (collectively referred to as the memory devices 112), and a control component 108 selectably coupled to the host interface 106 and the memory devices 112. The host interface 106 can be used to communicate information between the memory system 104 and another device, such as a host 102. The host 102 can include a processor (not shown). As used herein, "a processor" can be a number of processors, such as a parallel processing system, a number of coprocessors, etc. Example hosts can include and/or by implemented in laptop computers, personal computers, digital cameras, digital recording and playback devices, mobile telephones, PDAs, memory card readers, interface hubs, and the like.

In a number of embodiments, the host 102 can be associated with (e.g., include or be coupled to) an interface 103. The interface 103 can be configured to receive control inputs for a fabrication process. The interface 103 can enable input of scaled preferences (e.g., in numerically and/or structurally defined gradients) to define, for example, critical dimensions (CDs) of a final structure and/or intermediary structures of a memory device (e.g., the memory device 112-1) and/or an array of memory cells 114 formed thereon to be implemented by a processing apparatus. The scaled preferences can be provided to the interface 103 via input of a number of preferences stored by the host 102 and/or input of a number of preferences by a user (e.g., a human operator).

The host interface 106 can be in the form of a standardized physical interface. For example, when the memory system 104 is used for information (e.g., data) storage in the computing system 100, the host interface 106 can be a serial advanced technology attachment (SATA) physical interface, a peripheral component interconnect express (PCIe) physical interface, or a universal serial bus (USB) physical interface, among other physical connectors and/or interfaces. In general, however, the physical host interface 106 can provide an interface for passing control, address, information, scaled preferences, and/or other signals between the controller 108 of the memory system 104 and a host (e.g., the host 102) having compatible receptors for the host interface 106.

The controller 108 can include, for example, control circuitry (e.g., hardware), firmware, and/or software. The controller 108 can be operably coupled to and/or included on the same physical device (e.g., a die) as one or more of the memory devices 112. For example, the controller 108 can be or can include an application specific integrated circuit (ASIC) as hardware operably coupled to a printed circuit board including the host interface 106 and the memory devices 112. Alternatively, the controller 108 can be included on a separate physical device that is communicatively coupled to the physical device (e.g., die) that includes one or more of the memory devices 112.

The controller 108 can communicate with the memory devices 112 to direct operations to sense (e.g., read), program (e.g., write), and/or erase information, among other functions and/or operations for management of memory cells, as described herein. The controller 108 can have circuitry that can be a number of integrated circuits and/or discrete components. In a number of embodiments, the circuitry in the controller 108 can include control circuitry for controlling access across the memory devices 112, circuitry for providing a translation layer between the host 102 and the memory system 104, and/or circuitry coupled to a processing apparatus for direction of semiconductor processing. The controller 108 can include hardware, firmware, and/or software for analysis and/or implementation of, for instance, the management of memory cells and/or for management of formation of asymmetric source/drain regions of transistors, as described herein.

In a number of embodiments, such analysis can be performed as a result of input from the host 102 and/or the interface 103 of the scaled preferences provided by an automated program and/or by a human operator, among other possibilities. As such, the controller 108 and/or the hardware, firmware, and/or software that is associated therewith (e.g., is a component of the control component) can be configured with coded instructions stored on a non-transitory medium and executable by a processor and/or as an ASIC with logic to direct and/or perform a number of functions and operations for formation of asymmetric source/drain regions of transistors and/or associated deposition and etch processes, as described herein.

The memory devices 112 can each include, for example, a number of memory arrays 114 (e.g., arrays of volatile and/or non-volatile memory cells). For instance, the memory devices 112 can include arrays of memory cells. As will be appreciated, the memory cells in the memory arrays 114 of the memory devices 112 can be in a 1T1C (one transistor one capacitor) configuration or in a 2T2C (two transistors two capacitors) configuration, for example. The memory cells in the memory arrays 114 of the memory devices 112 can be in a RAM architecture (e.g., DRAM, SRAM, SDRAM, FeRAM, MRAM, ReRAM, etc.), a flash architecture (e.g., NAND, NOR, etc.), a three-dimensional (3-D) RAM and/or flash memory cell architecture, or some other memory array architecture including pillars and adjacent trenches.

In at least one embodiment, the memory device (e.g., the memory device 112-1) can include a first transistor (e.g., the transistor 220 illustrated in FIG. 2) and a second transistor (e.g., the transistor 222), each having asymmetric source/drain regions. A source/drain region of the first transistor can be directly coupled to a source/drain region of the second transistor at a junction. A depth of the junction is greater than a depth of another source/drain region of the first transistor and a depth of another source/drain region of the second transistor. In at least one embodiment, the memory device 112-1 can include a memory array 114 including the first and second transistors. The first and second transistors can be access transistors of the memory array 114. The memory array 114 can include a first DRAM cell including the first transistor and a second DRAM cell, adjacent to the first DRAM cell, including the second transistor.

One or more the memory devices 112 can be formed on the same die. A particular memory device (e.g., the memory device 112-1) can include one or more memory arrays 114 of memory cells formed on the die. In a number of embodiments, the same die can include sense circuitry 115 and a controller 116 associated with one or more memory arrays 114 formed on the die, or portions thereof. The sense circuitry 115 can be utilized to determine (sense) a particular data value (e.g., 0 or 1) that is stored at a particular memory cell in a row of a memory array 114. A control component 116 can be utilized to direct the sense circuitry 115 to sense particular data values, in addition to directing storage, erasure, etc., of data values, in response to a command from the host 102 and/or the interface 103. In a number of embodiments, the command can be sent directly to the control component 116 via the host interface 106 or to the controller 116 via the controller 108.

The embodiment illustrated in FIG. 1 can include additional circuitry that is not illustrated so as not to obscure embodiments of the present disclosure. For example, the memory devices 112 can include address circuitry to latch address signals provided over I/O connectors through I/O circuitry. Address signals can be received and decoded by a row decoder and a column decoder to access the memory array 114. It will be appreciated that the number of address input connectors can depend on the density and/or architecture of the memory devices 112 and/or the memory arrays 114.

Figure 2:
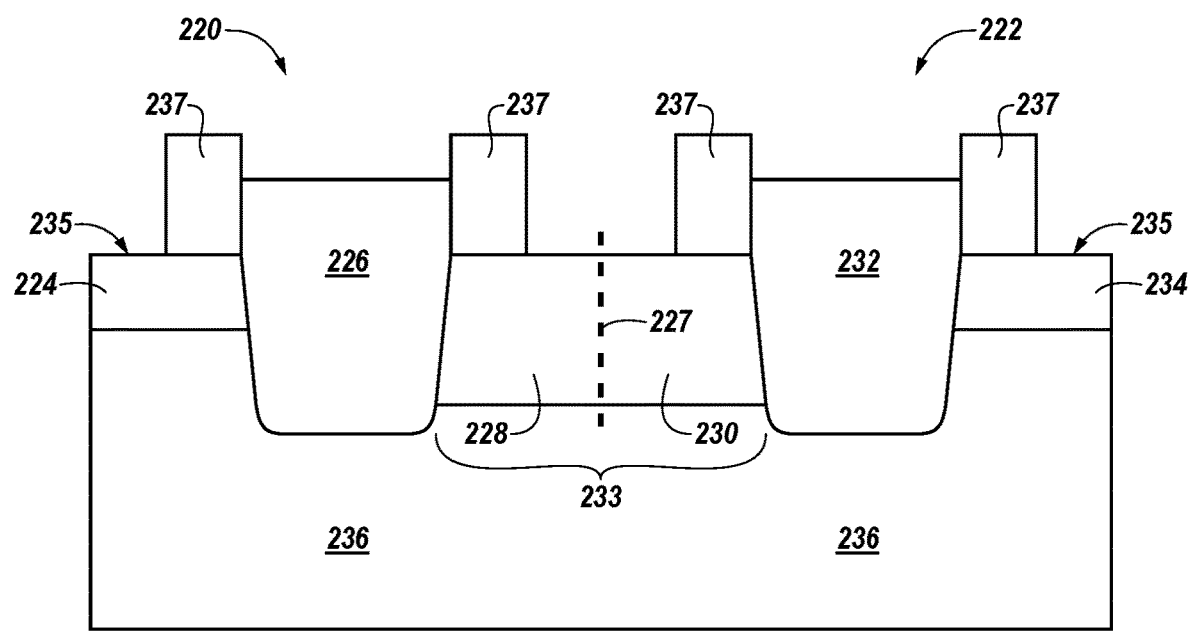
FIG. 2 illustrates a cross-sectional view of transistors having asymmetric source/drain regions in accordance with a number of embodiments of the present disclosure.

FIG. 2 illustrates a cross-sectional view of asymmetric source/drain regions 224, 228, 230, and 234 of transistors 220 and 222 in accordance with a number of embodiments of the present disclosure. The dashed line 227 illustrates a conceptual boundary between the source/drain region 228 of the transistor 220 and the source/drain region 230 of the transistor 222. However, they may not be a physical boundary between the source/drain region 228 and the source/drain region 230. As illustrated in FIG. 2, the depth of the source/drain region 224 of the transistor 220 and the source/drain region 234 of the transistor 222 is different than the depth of the source/drain region 228 of the transistor 220 and the source/drain region 230 of the transistor 222. The source/drain regions 224 and 234 are shallow with respect to a surface 235 of a substrate material 236 (e.g., a silicon substrate material). The source/drain regions 228 and 230 are deep with respect to the surface 235 of the substrate material 236. The source/drain region 228 can be directly coupled to the source/drain region 230 to form a junction 233 of the transistor 220 and the transistor 222. The depth of the junction 233 in the substrate material 236 can be approximately the depth of the gates 226 and/or 232 in the substrate material 236. As described in association with FIGS. 3A-3D below, the substrate material 236 between a gate 226 of the transistor 220 and a gate 232 of the transistor 222 can be doped deeper than the substrate material 236 on the opposite side of the gates 226 and 232, respectively. A spacer material 237 can be formed in contact with the gates 226 and 232.

In the example of FIG. 2, the source/drain region 224 is a drain of the transistor 220, the source/drain region 228 is a source of the transistor 220, the source/drain region 230 is a source of the transistor 222, and the source/drain region 234 is a drain of the transistor 222. However, embodiments of the present disclosure are no so limited. For example, the source/drain region 224 can be a source of the transistor 220, the source/drain region 228 can be a drain of the transistor 220, the source/drain region 230 can be a drain of the transistor 222, and the source/drain region 234 can be a source of the transistor 222. As another example, the source/drain region 224 can be a drain of the transistor 220, the source/drain region 228 can be a source of the transistor 220, the source/drain region 230 can be a drain of the transistor 222, and the source/drain region 234 can be a source of the transistor 222.

The asymmetric source/drain regions 224 and 228 of the transistor 220 and the asymmetric source/drain regions 230 and 234 of the transistor 222 provide benefits of both shallow source/drain regions and deep source/drain regions. The probability of SCE and/or capacitively coupling of adjacent transistors (e.g., the transistors 220 and 222) can be decreased. GIDL and DIBL of the transistors 220 and 222 can be reduced. However, the process of forming asymmetric source/drain regions can be more complex and/or costly than the process of forming symmetric source/drain regions.

FIGS. 3A-3D illustrate cross-sectional views of an asymmetric source/drain regions 324 and 334 of transistors 320 and 322 at particular points in an example semiconductor fabrication process in accordance with a number of embodiments of the present disclosure. The fabrication process illustrated in FIGS. 3A-3D is shown at particular points that correspond to particular processing activities being performed in the fabrication process; however, other processing activities included in various embodiments may be omitted for simplicity. The dashed line 327 illustrates a conceptual boundary between the source/drain region 328 and the source/drain region 330. However, they may not be a physical boundary between the source/drain region 328 and the source/drain region 330.

Figure 3A:
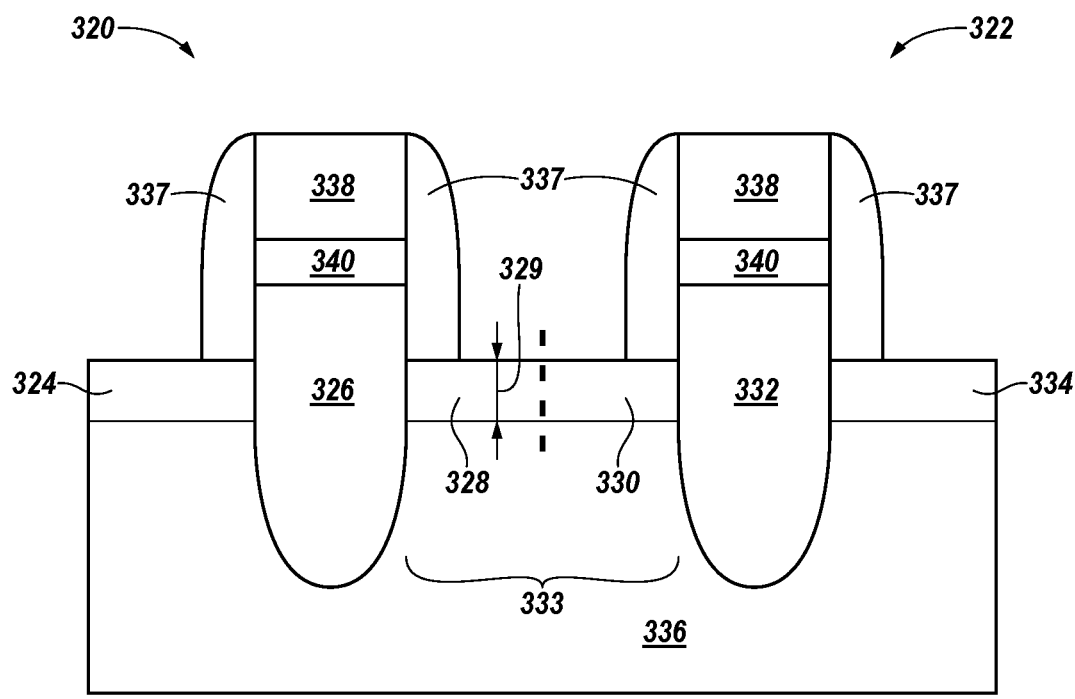
FIGS. 3A-3D illustrate cross-sectional views of transistors having asymmetric source/drain regions at particular points in an example semiconductor fabrication process in accordance with a number of embodiments of the present disclosure.

FIG. 3A illustrates a first doping operation of the fabrication process. Prior to the first doping operation, the gates 326 and 332 are recessed into the substrate material 336, which can be analogous to the gates 226 and 232 and the substrate material 236 illustrated in FIG. 2. The gates 326 and 332 can comprise a polymer-silicon material. The gates 326 and/or 332 can be n+ doped for a N-type metal-oxide-semiconductor (NMOS) transistor or p+ doped for a P-type metal-oxide-semiconductor (PMOS) transistor. A gate contact 340 (e.g., tungsten) can be formed on the gates 326 and 332. A gate mask material 338 (e.g., a hard mask material such as a nitride material) can be formed on the gate contact 340. The gate mask material 338 can be used for gate patterning, for example. As shown in FIG. 3A, a spacer material 337 can formed in contact with the gate mask material 338, the gate contact 340, and the gates 326 and 332. The spacer material 337 can be analogous to the spacer material 237 illustrated in FIG. 2. The spacer material 337 can comprise a combination of an oxide material and a nitride material.

The first doping operation illustrated in FIG. 3A dopes the substrate material 336 to a first depth 329. The first doping operation can dope the substrate material 336 for a first amount of time. The substrate material 336 can be n+ doped or p+ doped. The source/drain region 324 of the transistor 320, the source/drain region 334 of the transistor 322, and the junction 333 of the source drain/region 328 of the transistor 320 and the source drain/region 330 of the transistor 322 have approximately the first depth 329.

Figure 3B:
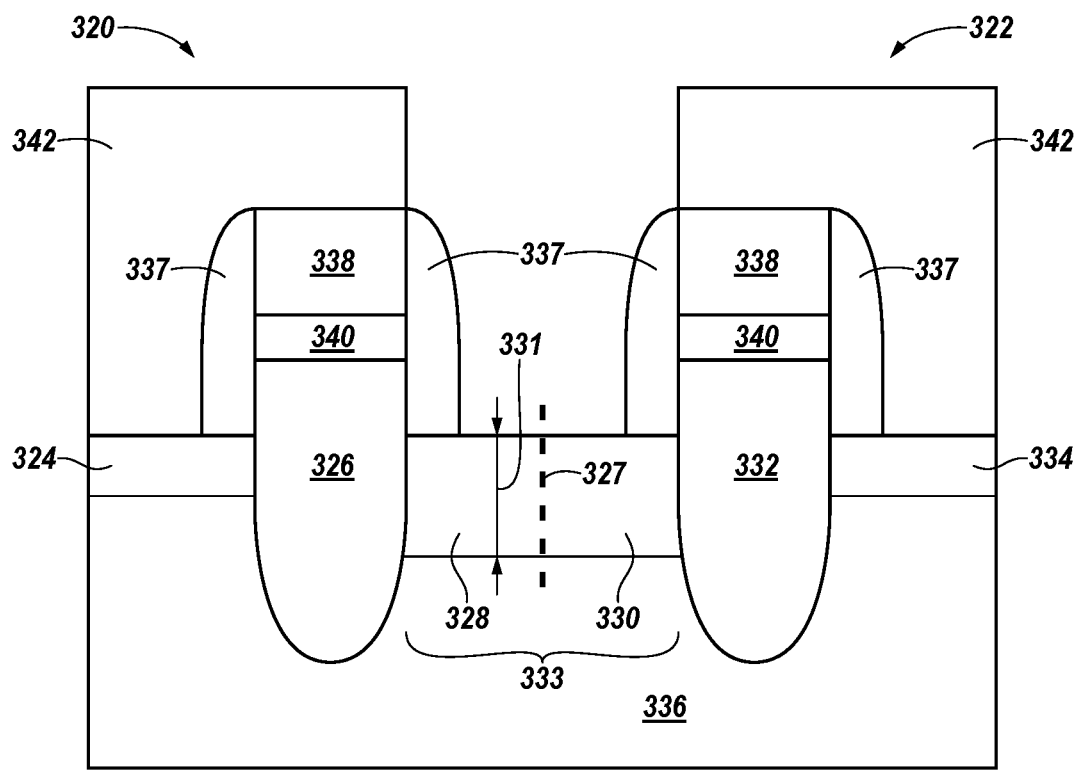

FIG. 3B illustrates a second doping operation of the fabrication process subsequent to the first doping operation illustrated in FIG. 3A. Prior to the second doping operation, a photoresist material 342 can be formed on the spacer material 337 and the gate mask material 338. The second doping operation dopes the junction 333 (e.g., the substrate material 336 between the gates 326 and 332) to a second depth 331. As show in FIG. 3, the photoresist material 342 can be used during the second doping operation to make sure that only the substrate material 336 between the gates 326 and 332 are doped during the second doping operation to form the deeper junction 333. The second depth 331 is greater than the first depth 329. The same dopant (e.g., n+ or p+) used in the first doping operation is used in the second doping operation.

After the second doping operation illustrated in FIG. 3B, the source/drain regions 324 and 334 have the first depth 329 and the source/drain regions 328 and 330 that comprise the junction 333 have the second depth 331. The second doping operation can dope the substrate material 336 between the gates 326 and 332 for a second amount of time that is subsequent to the first amount of time. Thus, the source/drain region 324 and the source/drain region 328 of the transistor 320 have different depths as a result of the different doping depths so that the source/drain regions 324 and 328 of the transistor 320 are asymmetric. Similarly, the source/drain region 334 and the source/drain region 330 of the transistor 320 have different depths as a result of the different doping depths so that the source/drain regions 334 and 330 of the transistor 322 are asymmetric.

Figure 3C:
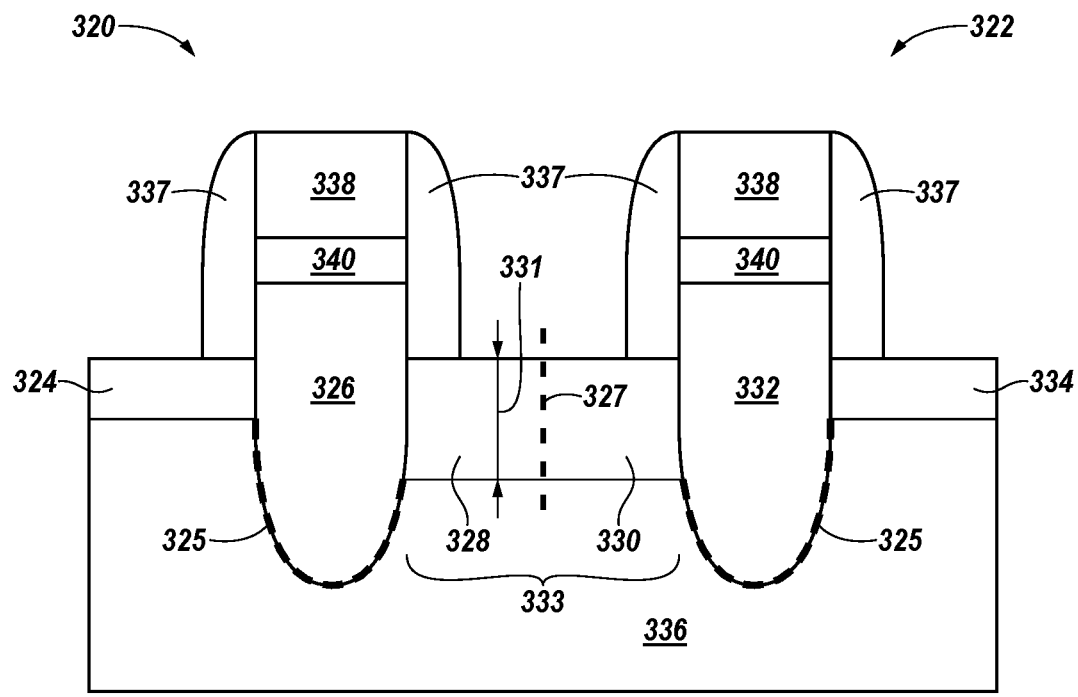

FIG. 3C illustrates a drive-in operation of the fabrication process subsequent to the second doping operation illustrated in FIG. 3B. The photoresist material 342 is removed after the drive-in operation. The dashed lines 325 represent a channel region for electrical conduction between the source/drain region 324 and the source/drain region 328 and between the source/drain region 334 and the source/drain region 330.

Figure 3D:
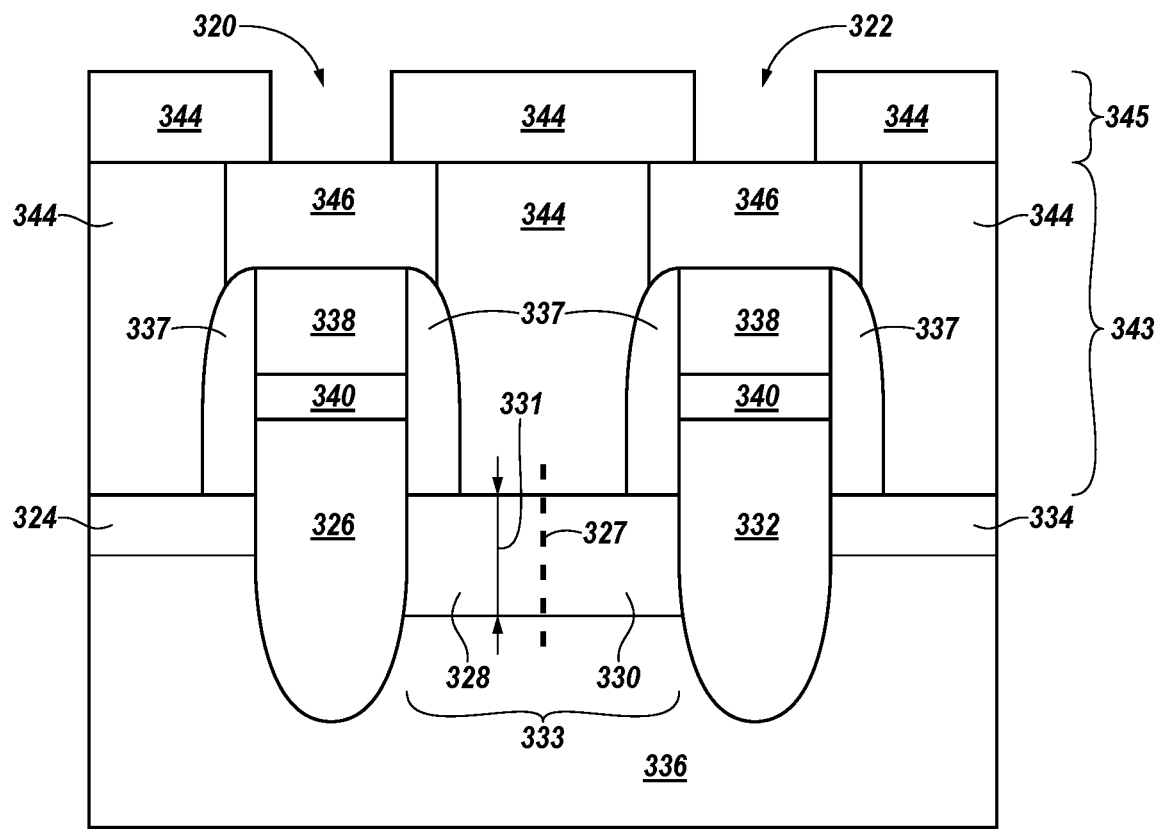

FIG. 3D illustrates formation of a metallic material 344 during the fabrication process. The metallic material 344 can be formed subsequent to the drive-in operation illustrated in FIG. 3C. The metallic material 344 can be formed in contact with the spacer material 337, the source/drain regions 324 and 334, and the junction 333. An insulation material 336 (e.g., a dielectric material) can be formed on the spacer material 337 and the gate mask material 338, and in contact with the metallic material 344. In at least one embodiment, a first portion 343 of the metallic material 344 can be formed in contact with the spacer material 337, the source/drain regions 324 and 334, and the junction 333. Then, the insulation material 346 can be formed on the spacer material 337 and the gate mask material 338, and in contact with the first portion 343 of the metallic material 344. A second portion 345 of the metallic material 344 can then be at least partially formed on the insulation material 346 and the first portion 343 of the metallic material 344.

Although FIGS. 3A-3D are described in reference to a single pair of the transistors 320 and 322 formed in the substrate material 336, at least one embodiment includes a plurality of pairs of the gates 326 and 332 of the transistors 320 and 322 formed in the substrate material 336. A first doping operation can be performed on the substrate material 336 to dope the substrate material to the first depth. A second doping operation can be performed on only a respective portion of the substrate material 336 between each respective pair of the gates 326 and 332 of the transistors 320 and 322.

Figure 4:
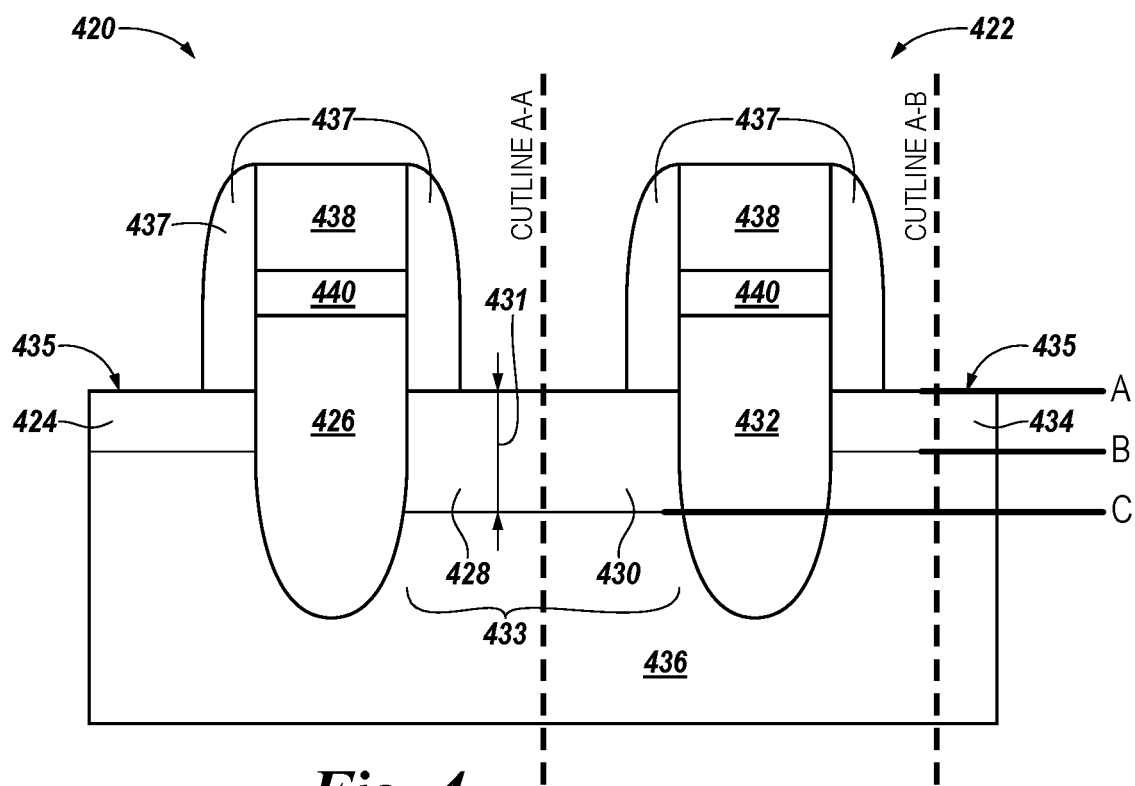
FIG. 4 illustrates cross-sectional views of an asymmetric source/drain regions of transistors in accordance with a number of embodiments of the present disclosure.

FIG. 4 illustrates cross-sectional views of an asymmetric source/drain regions 424, 428, 430, and 434 of transistors 420 and 422 in accordance with a number of embodiments of the present disclosure. FIG. 4 illustrates three depths A, B, and C in the substrate material 436. The depth A corresponds to the surface 435 of the substrate material 436. The depth B corresponds to the depth of the source/drain regions 424 and 434. The depth B can be the depth of doping of the substrate material 436 after a first doping operation illustrated in FIG. 3A. The depth C corresponds to the depth of the source/drain regions 428 and 430 and the junction 433. The depth C can be the depth of doping of the substrate material 436 at the junction 433 after a second doping operation illustrated in FIG. 3B.

The source/drain regions 424 and 434 can have a first doping concentration at the depth A (the surface 435 of the substrate material 436). At the depth B, the source/drain regions 424 and 434 can have a second doping concentration at or near the bottom of the source/drain regions 424 and 434. The first doping operation illustrated in FIG. 3A can dope the substrate material 436 between the gates 426 and 432 to have the same or similar doping profile at the cutline A-A as the source/drain regions 424 and 434 from the depth A to the depth B.

The source/drain regions 428 and 430, and the junction 433, can have the first doping concentration at the depth A. However, at the depth C, the source/drain regions 428 and 430 can have a third doping concentration at or near the bottom of the source/drain regions 428 and 430. The third doping concentration is greater than the second doping concentration. In at least one embodiment, the third doping concentration can be at least one order of magnitude greater than the second doping concentration.

FIGS. 5A-5D illustrate cross-sectional views of an asymmetric source/drain regions 524, 528, 530, and 534 of transistors 520 and 522 at particular points in an example semiconductor fabrication process in accordance with a number of embodiments of the present disclosure. The fabrication process illustrated in FIGS. 5A-5D is shown at particular points that correspond to particular processing activities being performed in the fabrication process; however, other processing activities included in various embodiments may be omitted for simplicity. The dashed line 527 illustrates a conceptual boundary between the source/drain region 528 and the source/drain region 530. However, they may not be a physical boundary between the source/drain region 528 and the source/drain region 530.

Figure 5A:
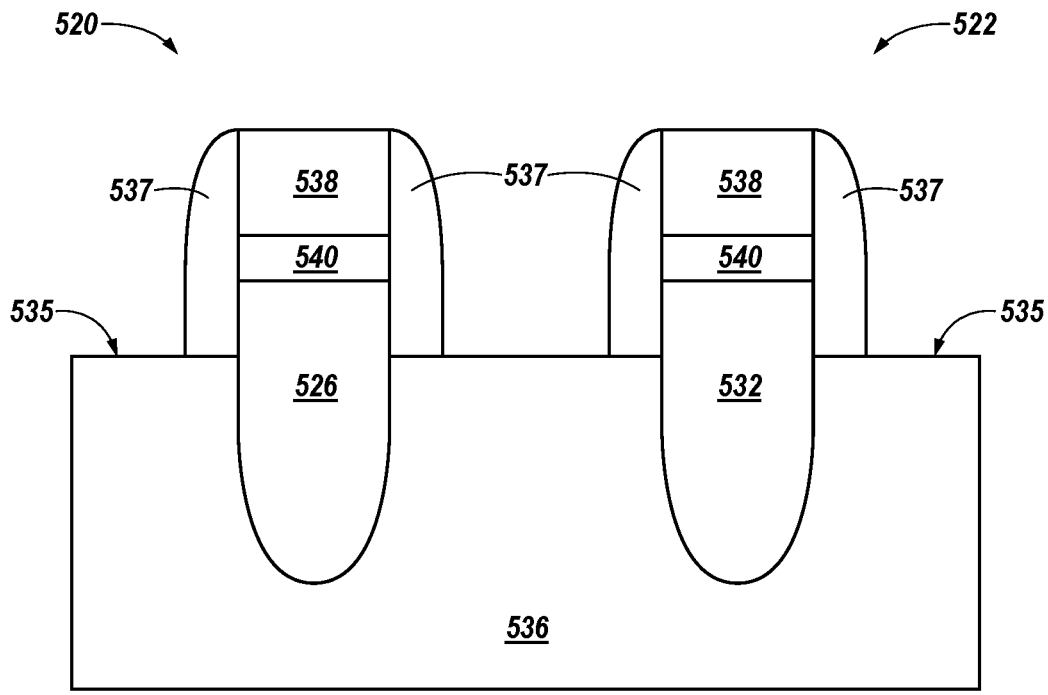
FIGS. 5A-5D illustrate cross-sectional views of transistors having asymmetric source/drain regions at particular points in an example semiconductor fabrication process in accordance with a number of embodiments of the present disclosure.

FIG. 5A illustrates a state of the transistors 520 and 522 during the fabrication process. The gates 526 and 532 are recessed into the substrate material 536, which can be analogous to the gates 226 and 232 and the substrate material 236 illustrated in FIG. 2. The gates 526 and 532 can comprise a polymer-silicon material. The gates 526 and/or 532 can be n+ doped for a NMOS transistor or p+ doped for a PMOS transistor. A gate contact 540 (e.g., tungsten) can be formed on the gates 526 and 532. A gate mask material 538 (e.g., a hard mask material such as a nitride material) can be formed on the gate contact 540. The gate mask material 538 can be used for gate patterning, for example. As shown in FIG. 5A, a spacer material 537 can formed in contact with the gate mask material 538, the gate contact 540, and the gates 526 and 532. The spacer material 537 can be analogous to the spacer material 237 illustrated in FIG. 2. The spacer material 537 can comprise a combination of an oxide material and a nitride material.

Figure 5B:
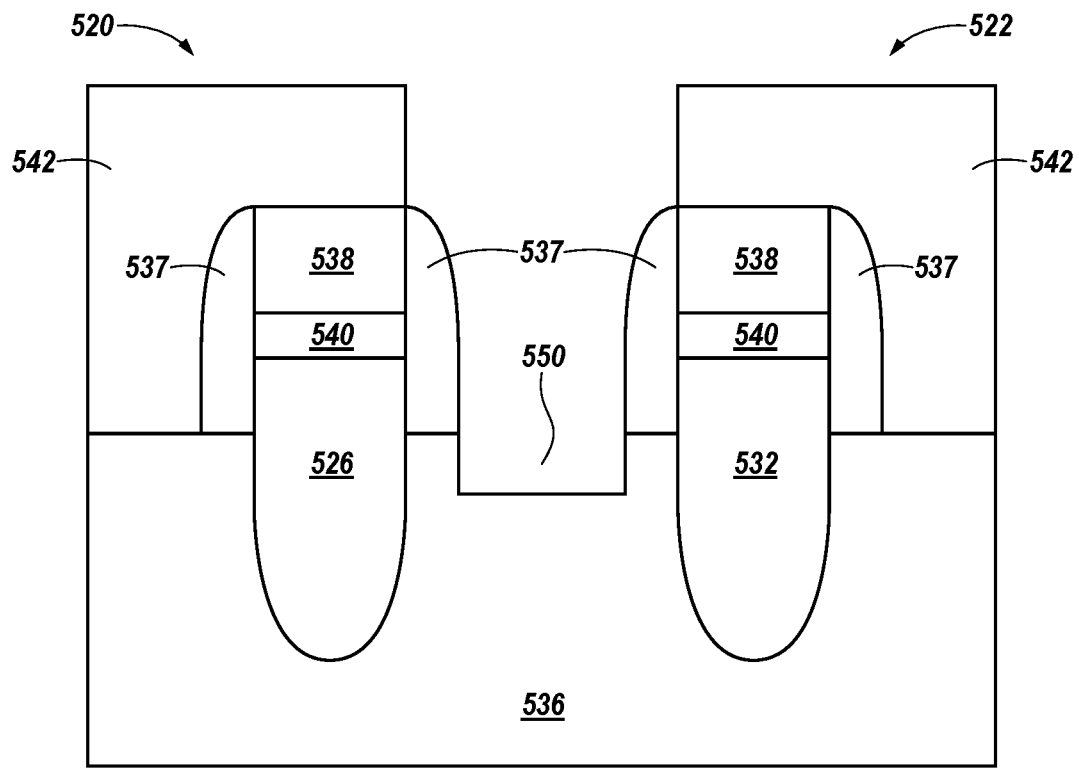

FIG. 5B illustrates an etching operation of the fabrication process. Prior to the etching operation, a photoresist material 542 can be formed on the spacer material 537 and the gate mask material 538. The etching operation forms a trench 550 in the substrate material 536 between the gates 526 and 532. The photoresist material 542 can be used to make sure that only the substrate material 336 between the gates 526 and 532 is etched (e.g., removed) to form the trench 550. The trench 550 can be formed via a dry etching operation or a wet etching operation. As illustrated in FIG. 5B, the width of the trench 550 can be such that the side walls of the trench 550 are at least partially coplanar with the spacer material 537.

Figure 5C:
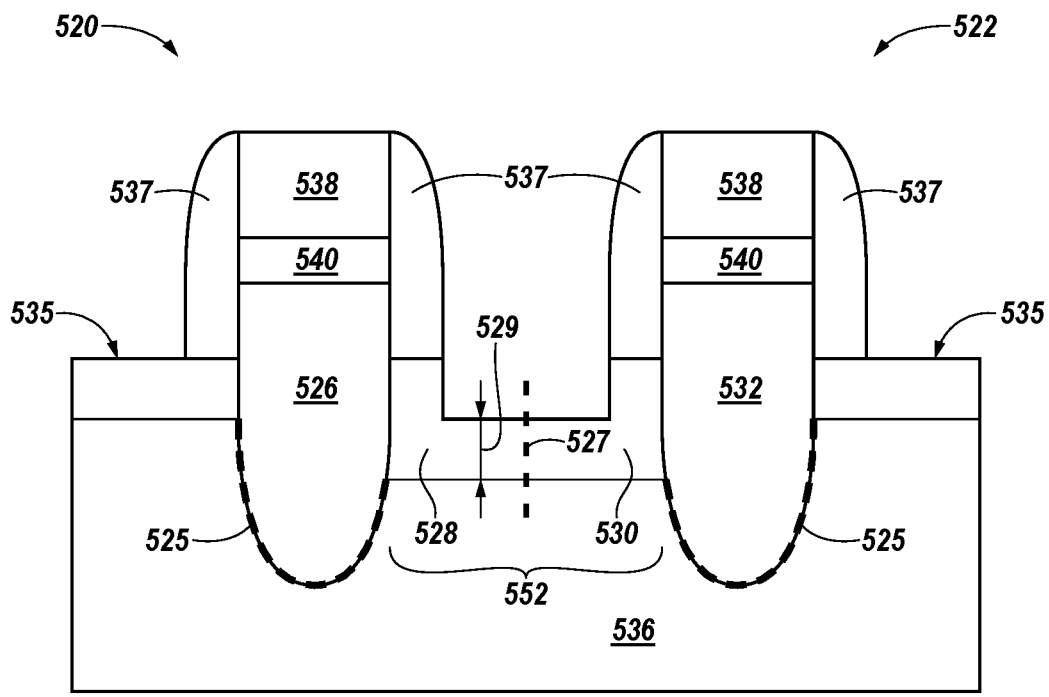

FIG. 5C illustrates a doping operation of the fabrication process subsequent to the etching operation illustrated in FIG. 5B. The photoresist material 542 is removed before the doping operation. The doping operation dopes the substrate material 536 to a depth 529. A single doping operation can be performed to form the source/drain regions 524, 528, 530, and 534 as well as the junction 552. The substrate material 536 can be n+ doped or p+ doped. A drive-in operation can be performed after the doping operation.

As illustrated in FIG. 5C, the source/drain region 524 of the transistor 520, the source/drain region 534 of the transistor 522, and the junction 552 of the source drain/region 528 of the transistor 520 and the source drain/region 530 of the transistor 522 have approximately the same depth, the depth 529. The depth 529 can be the same as the first depth 329 described in association with FIG. 3A above. The junction 552 is located in the substrate material 536 at the trench 550. Although the junction 552 is doped to approximately the same depth (e.g., the depth 529) as the source/drain regions 524 and 534, the junction 552 is as deep into the substrate material 536 as the junction 333 illustrated in FIGS. 3C and 3D with respect to the surface 535 of the substrate material 536. That is, the bottom (as illustrated in FIG. 5C) of the junction 552 is at a different depth relative to the surface 535 than the bottom of the source/drain regions 524 and 534. Thus, the source/drain region 524 and the source/drain region 528 of the transistor 320 are at different depths relative to each other (e.g., the source/drain region 425 is higher in the substrate material 436 than the source/drain region 428) so that the source/drain regions 524 and 528 of the transistor 520 are asymmetric. Similarly, the source/drain region 534 and the source/drain region 530 of the transistor 520 are at different depths relative to one another (e.g., the source/drain region 534 is higher in the substrate material 536 than the source/drain region 530) so that the source/drain regions 534 and 530 of the transistor 522 are asymmetric.

Figure 5D:
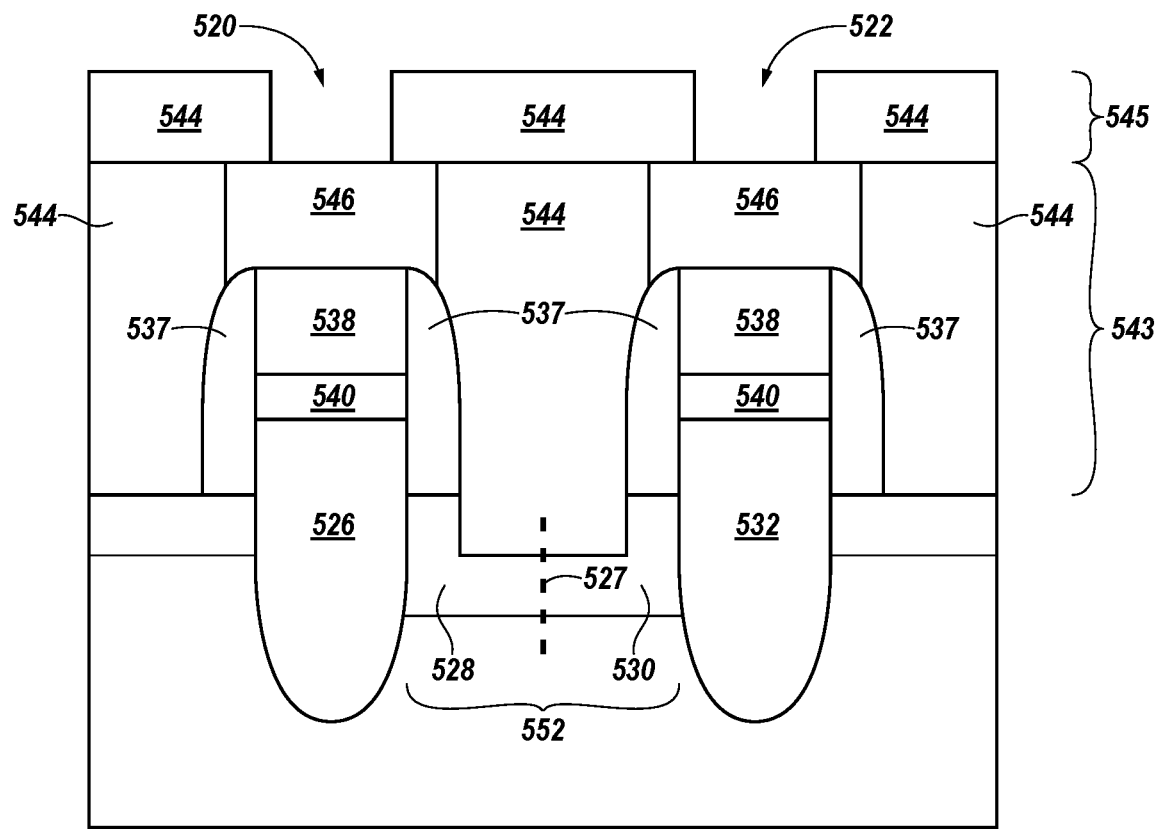

FIG. 5D illustrates formation of a metallic material 544 subsequent to the doping operation of the fabrication process illustrated in FIG. 5C. The metallic material 544 can be formed subsequent to the drive-in operation. The metallic material 544 can be formed in contact with the spacer material 537, the source/drain regions 524 and 534, and the junction 552. As illustrated in FIG. 5D, the metallic material 544 can be formed in the trench 550. An insulation material 536 (e.g., a dielectric material) can be formed on the spacer material 537 and the gate mask material 538, and in contact with the metallic material 544. In at least one embodiment, a first portion 543 of the metallic material 544 can be formed in contact with the spacer material 537, the source/drain regions 524 and 534, and the junction 552. Then the insulation material 546 can be formed on the spacer material 537 and the gate mask material 538, and in contact with the first portion 543 of the metallic material 544. A second portion 545 of the metallic material 544 can then be at least partially formed on the insulation material 546 and the first portion 543 of the metallic material 344.

Figure 6:
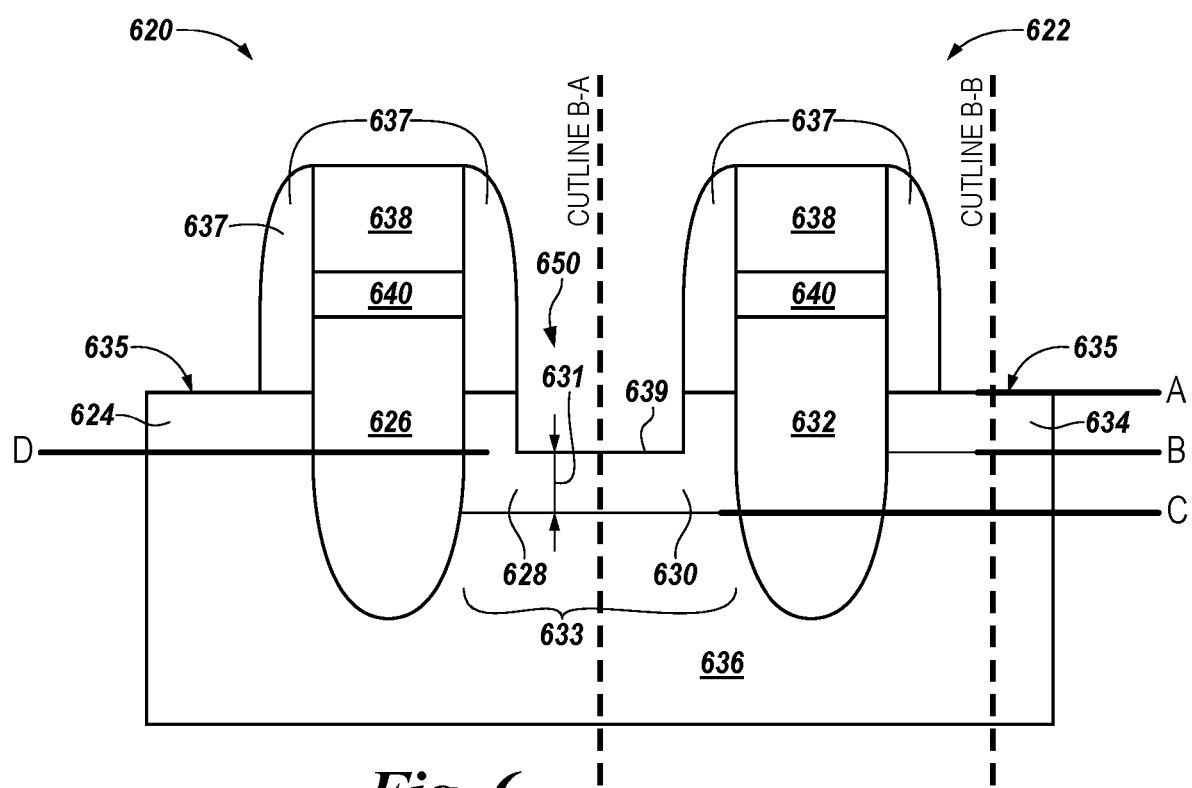
FIG. 6 illustrates cross-sectional views of an asymmetric source/drain regions of transistors in accordance with a number of embodiments of the present disclosure.

FIG. 6 illustrates cross-sectional views of an asymmetric source/drain regions 624, 628, 630, and 634 of transistors 620 and 622 in accordance with a number of embodiments of the present disclosure. FIG. 6 illustrates three depths A, B, and C in the substrate material 636. The depth A corresponds to the surface 635 of the substrate material 636. The depth A corresponds to the depth of the source/drain regions 624 and 634. The depth B can be the depth of doping of the substrate material 636 after a doping operation illustrated in FIG. 5C. The depth C corresponds to the depth of the source/drain regions 628 and 630 and the junction 652. The depth C can be the depth of doping of the substrate material 636 between the gates 626 and 632 after the doping operation illustrated in FIG. 5C. The depth D corresponds to the bottom 639 of the trench 650.

The source/drain regions 624 and 634 can have a first doping concentration at the depth A (the surface 635 of the substrate material 636). At the depth B, the source/drain regions 624 and 634 can have a second doping concentration at or near the bottom of the source/drain regions 624 and 634.

The source/drain regions 628 and 630, and the junction 652, can have the first doping concentration at the depth D (e.g., at the bottom 639 of the trench 650). At the depth C, the source/drain regions 628 and 630 can have the second doping concentration at or near the bottom of the source/drain regions 628 and 630. The third doping concentration is greater than the second doping concentration.

The gate of a transistor can also be referred herein to as a recessed access device (RAD). A lateral scaling factor can be used to control the lateral dimensions of components of the first and second transistors, such as the width of the gates, the thickness of a spacer material (e.g., the spacer material 237), and the pitch of the first and second transistors.

Using asymmetric source/drain regions can significantly reduce DIBL as compared to previous approaches that use only deep source/drain regions, which can provide improved SCE control. Using asymmetric source/drain regions does not significantly increase DIBL as compared to previous approaches that use only shallow source/drain regions. Thus, asymmetric source/drain regions can provide the same or similar SCE control as shallow source/drain regions.

In prior transistors having symmetric source/drain regions, the current flow through the transistors may not change depending on to which source/drain region of the transistor a voltage is applied. In contrast, the transistors in accordance with the present disclosure have asymmetric source/drain regions so that one source/drain region is deeper than the other source/drain region. As a result, the source/drain regions can have different contact resistances and show different current flows when the source/drain regions are forward or reverse biased.

Transistors having asymmetric source/drain regions does not have significantly higher gate disturbs (e.g., a change in the threshold voltage at a constant current) than previous approaches that use only shallow or deep source/drain regions. The gate disturbs of transistors having asymmetric source/drain regions can be less than the gate disturbs of transistors having only shallow source/drain regions, especially at lower lateral scaling factors.

In at least one embodiment in accordance with the present disclosure, control inputs and/or instructions can be received (from a host, for example) to direct performance of operations. For example, the instructions can include the operations described in association with FIGS. 3A-3D and 5A-5D above. In at least one embodiment, control inputs can be implemented to control a second depth of doping of a substrate material (e.g., the substrate material 236) based at least in part on the first depth of the doping of the substrate material. In at least one embodiment, control inputs can be received to control a pitch of the first and second transistors, wherein the control inputs are scalable, respectively, proportionally relative to a design rule. In at least one embodiment, control inputs can be received to form a trench in the substrate material between the gates of the first transistor and the second transistor. In at least one embodiment, control inputs can be received to direct the processing apparatus to dope the substrate material at a trench to the second depth, wherein the second depth is approximately the first depth. In at least one embodiment, control inputs can be received to control at least one dimension of the trench in the substrate material between the gates of the first and second transistors and control the depth of the doping of the substrate material.

In at least one embodiment, a user interface, such as the user interface 103 described in association with FIG. 1 above, can be configured to enable input of scaled preferences (e.g., in numerically and/or structurally defined gradients) to define dimensions of a first transistor (e.g., the transistor 220) and a second transistor (e.g., the transistor 222) based at least in part on performance of the operations described herein. The scaled preferences can, for example, determine the width of the gates, the thickness of a spacer material, and the pitch of the first and second transistors.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only, and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of, semiconductor materials, underlying component materials, mask materials, structural materials, dielectric materials, substrate materials, memory devices, trenches, scaled preferences, critical dimensions, processing apparatuses, controllers, control components, and/or hosts, among other materials and/or components related to asymmetric source/drain regions of transistors, have been illustrated and described herein, embodiments of the present disclosure are not limited to those combinations explicitly recited herein. Other combinations and configurations of the semiconductor materials, underlying component materials, mask materials, structural materials, dielectric materials, substrate materials, memory devices, trenches, scaled preferences, critical dimensions, processing apparatuses, controllers, control components, and/or hosts, among other materials and/or components related to asymmetric source/drain regions of transistors than disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a first transistor and a second transistor, each having asymmetric source/drain regions, wherein:
        a source/drain region of the first transistor is directly coupled to a source/drain region of the second transistor to form a junction;
        a depth of the junction is greater than a depth of another source/drain region of the first transistor and a depth of another source/drain region of the second transistor;
        the other source/drain regions of the first and second transistors have a same depth of a doping of a substrate material as a depth of a doping of the substrate material at the junction; and
        the other source/drain regions of the first and second transistors are higher within the substrate material than the junction.

2. The apparatus of claim 1, wherein the junction includes a deeper doping of a substrate material than a doping of the substrate material of the other source/drain regions of the first and second transistors.

3. The apparatus of claim 1, wherein the junction is located in a trench in the substrate material.

4. The apparatus of claim 1, wherein the depth of the junction is a depth of gates of the first and second transistors into a substrate material.

5. A method, comprising:
    forming a trench in a substrate material between adjacent gates of a first transistor and a second transistor; and
    doping, in a single doping operation, the substrate material to a same depth to form first source/drain regions of a first transistor and a second transistor and a junction of a second source/drain region of the first transistor and a second source/drain region of the second transistor, wherein the junction is located at the trench in the substrate material; a depth of the junction is greater than a depth of another source/drain region of the first transistor and a depth of another source/drain region of the second transistor,
wherein the first source/drain regions of the first and second transistors have a same depth of doping of the substrate material as the second source/drain regions of the first and second transistors, and
wherein the first source/drain regions of the first and second transistors are higher within the substrate material than the junction.

6. The method of claim 5, wherein forming the trench includes performing an etching operation on the substrate material between the gates of the first and second transistors.

7. The method of claim 5, wherein doping the substrate material in the single doping operation includes:
doping the substrate material to a first doping concentration at a surface of the substrate material and to a second doping concentration at a first depth relative to the surface of the substrate material; and
doping the substrate material between the gates of the first and second transistors to the first doping concentration at a bottom of the trench and to the second doping concentration at a depth relative to the bottom of the trench.

8. The method of claim 5, wherein:
a plurality of pairs of the adjacent gates are formed in the substrate material; and
the method further comprises:
performing an etching operation on a respective portion of the substrate material between each respective pair of the adjacent gates to form a respective trench between each pair of the adjacent gates; and
performing the single doping operation on the substrate material subsequent to performing the etching operation.

9. The method of claim 5, further comprising forming a conductive contact in the trench to electrically couple the second source/drain region of the first transistor to the second source/drain region of the second transistor at the junction.

10. The method of claim 5, further comprising receiving control inputs to:
control at least one dimension of the trench in the substrate material between the gates of the first and second transistors; and
control the depth of the doping of the substrate material.

11. A system, comprising:
a memory device including a first transistor and a second transistor, each having asymmetric source/drain regions, wherein:
a source/drain region of the first transistor is directly coupled to a source/drain region of the second transistor to form a junction;
a depth of the junction is greater than a depth of another source/drain region of the first transistor and a depth of another source/drain region of the second transistor;
the other source/drain regions of the first and second transistors have a same depth of a doping of a substrate material as a depth of a doping of the substrate material at the junction; and
the other source/drain regions of the first and second transistors are higher within the substrate material than the junction.

12. The system of claim 11, wherein:
the memory device includes a memory array including the first and second transistors; and
the first and second transistors are access transistors of the memory array.

13. The system of claim 12, wherein the memory array includes:
a first dynamic random access memory (DRAM) cell including the first transistor; and
a second DRAM cell, adjacent to the first DRAM cell, including the second transistor.

14. The system of claim 12, wherein each of the first and second transistors is a recessed access device (RAD).

* * * * *